United States Patent [19]

Yamamoto et al.

[11] Patent Number: 5,023,144

[45] Date of Patent: Jun. 11, 1991

[54] SILVER ALLOY FOIL FOR INTERCONNECTOR FOR SOLAR CELL

[75] Inventors: Shigeru Yamamoto; Satoru Mori; Akira Hayashi, all of Sanda, Japan

[73] Assignee: Mitsubishi Metal Corporation, Tokyo, Japan

[21] Appl. No.: 497,984

[22] Filed: Mar. 23, 1990

[30] Foreign Application Priority Data

Mar. 24, 1989 [JP] Japan ................................. 1-73336
Mar. 24, 1989 [JP] Japan ................................. 1-73337

[51] Int. Cl.$^5$ ............................................. C22C 5/06
[52] U.S. Cl. .................................. 428/606; 420/501
[58] Field of Search ......................... 428/606; 420/501

[56] References Cited

U.S. PATENT DOCUMENTS

| | | | |
|---|---|---|---|
| 2,046,056 | 6/1936 | Breiner | 420/501 |
| 2,157,933 | 5/1939 | Hensel et al. | 420/501 |
| 2,196,307 | 4/1940 | Hensel et al. | 420/501 |
| 2,199,458 | 5/1940 | Hensel et al. | 420/501 |
| 2,947,623 | 8/1960 | Lincoln | 420/501 |
| 4,885,135 | 12/1989 | Hosoda et al. | 428/606 |

FOREIGN PATENT DOCUMENTS

| | | | |
|---|---|---|---|
| 51-26889 | 8/1976 | Japan | 420/501 |
| 56-19629 | 2/1981 | Japan | 420/501 |
| 60-204844 | 10/1985 | Japan | 420/501 |
| 316552 | 10/1971 | U.S.S.R. | 420/501 |
| 399261 | 10/1933 | United Kingdom | 420/501 |

OTHER PUBLICATIONS

Patent Abstracts of Japan, vol. 13, No. 88 (E-721) [3436], Feb. 28, 1989; & JP-A-63 266 887 (Mitsubishi Metal Corp.) 02-11-1988 *Whole Document*.
Patent Abstracts of Japan, vol. 7. No. 205 (C-185) [1350], Sep. 9, 1983; & JP-A-58 104 144 (Tanaka Kikinzoku Kogyo K.K.) 6-21-1983 *Whole Document*.
Patent Abstracts of Japan, vol. 10, No. 67 (C-333) [2124], Mar. 15, 1986; & JP-A-60 204 844 (Sumitome Denki Kogyo K.K.) 10-16-1985 *Whole Document*.
Patent Abstracts of Japan, vol. 12, No. 410 (C-540) [3257], Oct. 28, 1988; & JP-A-63 149 341 (Tokuriki Honten Co., Ltd) 6-22-1988.
Journal of the Physical Society of Japan, vol. 56, No. 9, Sep. 1987, pp. 3240-3247, Tokyo, JP; M. Kurisu et al.: "Transport properties of LaAg1-xInx, CeAg1-xInx and Rag (R=Pr, Nd, Gd and Y)".

*Primary Examiner*—John J. Zimmerman
*Attorney, Agent, or Firm*—Oblon, Spivak, McClelland, Maier & Neustadt

[57] ABSTRACT

There is disclosed a silver alloy foil for an interconnector of a solar cell. The silver alloy contains 10 ppm to 1,000 ppm of calcium; 10 ppm to 750 ppm of at least one element selected from the group consisting of beryllium, lanthanum and indium; balance silver and unavoidable impurities. The alloy is less susceptible to softening even when the solar cell is exposed to temperature cycling. If calcium is further added, the hardness does not decrease even with the passage of time, to thereby exhibit superior characteristics for a prolonged period of time.

2 Claims, No Drawings

SILVER ALLOY FOIL FOR INTERCONNECTOR FOR SOLAR CELL

BACKGROUND OF THE INVENTION

1. Field of the Invention

The present invention pertains to a silver alloy foil for use in an interconnector of a Si or Ga-As solar cell employed in satellites or the like, and in particular to a foil which is less susceptible to softening even when the solar cell is exposed to temperature cycling.

2. Prior Art

As disclosed in Japanese Patent Application 18-Month Publication No. 62-101441, the same applicant developed a foil for an interconnector of a solar cell which was made of silver alloy containing 10 to 1000 ppm by weight (hereinafter referred to as "ppm") of calcium, balance silver and unavoidable impurities. In this silver alloy foil, the characteristics do not change with the passage of time as long as the circumstances remain unchanged.

However, when the above silver alloy foil is exposed to severe temperature cycling which may occur in outer space, the characteristics, in particular the hardness, gradually decrease as time passes, and hence it is difficult to maintain the characteristics so as not to deteriorate over a prolonged period of time.

SUMMARY OF THE INVENTION

It is therefore an object of the present invention to provide a silver alloy foil for use in an interconnector of a solar cell which is less susceptible to softening even when the solar cell is exposed to temperature cycling.

According to the present invention, there is provided a foil for an interconnector of a solar cell made of a silver alloy which contains 10 ppm to 750 ppm of at least one element selected from the group consisting of beryllium (Be), lanthanum (La) and indium (In); balance silver (Ag) and unavoidable impurities.

The above silver alloy foil is less susceptible to softening even when the solar cell is exposed to temperature cycling. However, when 10 ppm to 1,000 ppm of calcium is further added, the hardness does not decrease even with the passage of time, to thereby exhibit superior characteristics for a prolonged period of time.

DETAILED DESCRIPTION OF THE INVENTION

After an extensive study on the silver alloy foil for use in an interconnector of a solar cell, the inventors have come to know that if beryllium, lanthanum and indium are added as constituents elements, the resulting alloy foil becomes less susceptible to softening even when the solar cell is exposed to temperature cycling.

A silver alloy foil in accordance with the present invention is developed in view of the foregoing, and is characterized in that it is made of a silver alloy which contains 10 ppm to 750 ppm of at least one element selected from the group consisting of beryllium, lanthanum and indium; balance silver and unavoidable impurities.

Beryllium, lanthanum and indium are effective to prevent the decrease of the hardness when the solar cell is exposed to temperature cycling. However, if the content of at least one of beryllium, lanthanum and indium is less than 10 ppm, the reduction in the hardness due to temperature cycling cannot be sufficiently prevented. In contrast, if the content exceeds 750 ppm, the conductivity deteriorates abruptly. In addition, since the oxdized film tends to be easily formed, it is very difficult to carry out spot welding. Furthermore, it becomes difficult to work the foil due to its unduly increased hardness.

The silver alloy foil in accordance with the present invention exhibits a superior conductivity, and is less susceptible to softening even when exposed to severe temperature cycling, so that the characteristics obtained immediately after its manufacture can be maintained for a prolonged period of time. Therefore, the alloy foil can exhibit a superior performance for a prolonged period of time and can be successfully utilized for an interconnector of a solar cell.

In the foregoing, calcium may be preferably added since calcium serves to prevent the alloy from being softened with the passage of time. However, if the calcium content is less than 10 ppm, such a effect cannot be obtained. On the other hand, if the calcium content exceeds 1,000 ppm, its conductivity decreases abruptly. Therefore, it is preferable that the content ranges from 10 ppm to 1,000 ppm. In addition, when calcium is also present, the function of the elements such as beryllium, lanthanum and indium is enhanced even further, so that the superior characteristics of the alloy can be maintained for a further prolonged period of time.

The present invention will now be described in more detail by way of examples.

EXAMPLE 1

A usual vacuum melting furnace was used to prepare silver alloy melts having various compositions as set forth in TABLES 1-1 and 1-2. The melts were cast into ingots each having a thickness of 10 mm, a width of 120 mm and a length of 200 mm, and the opposite surfaces of each ingot were machined, so that ingots of 8 mm in thickness were obtained. Then, for each ingot, Micro Vickers Hardness was measured under a load of 5 g, and conductivity was measured using an eddy current conductometer. Thereafter, each ingot was subjected to cold rolling under ordinary conditions to produce silver alloy foils 1 to 25 in accordance with the present invention and prior art silver alloy foils 1 to 5 each having a thickness of 0.03 mm.

Subsequently, immediately after the manufacture, the Micro Vickers Hardness was measured under a load of 5 g for each foil. In addition, each foil was held at 300° C. for 30 minutes, and was immediately immersed and cooled in water at room temperature. These changes were repeated one hundred times, and then the Micro Vickers Hardness was measured under a load of 5 g. The results are set forth in TABLES 1-1 and 1-2.

As will be seen from TABLES 1-1 and 1-2, in the silver alloy foils 1 to 25 of the invention, the decrease in the hardness of the foil subjected to the temperature cycling, which was more severe than those encountered in the space, is extremely small as compared with the hardness of the alloy immediately after the manufacture, which was obtained due to hardening during cold drawing. In addition, the alloy foils 1 to 25 of the invention have great conductivity of 102% or more. In contrast, all of the prior art alloy foils 1 to 5 are less resistant to the temperature cycling, resulting in a considerable decrease in hardness.

EXAMPLE 2

A usual vacuum melting furnace was used to prepare silver alloy melts having compositions as set forth in TABLES 2-1 and 2-2. Then, the same procedures as in EXAMPLE 1 were repeated to produce silver alloy foils 26 to 50 in accordance with the present invention and prior art silver alloy foils 6 to 10 each having a thickness of 0.03 mm.

Subsequently, as was the case with EXAMPLE 1, the testing of hardness was carried out. Furthermore, the hardness of each alloy foil was measured under a load of 5 g when the alloy foil manufactured was held at the room temperature for six months. The results are also set forth in TABLES 2-1 and 2-2.

As will be seen from TABLES 2-1 and 2-2, in the silver alloy foils 26 to 50 of the invention, the decrease in the hardness of the foil subjected to the temperature cycling is extremely small as compared with the hardness of the alloy immediately after the manufacture, and the decrease in the hardness after six months passed is also very small. In addition, the alloy foils of the invention have great conductivity of 94% or more. On the other hand, although the prior art alloy foils 6 to 10 are less susceptible to softening and have great conductivity at room temperature, they are subject to considerable decrease in hardness when exposed to severe temperature cycling.

TABLE 1

| | Composition of Ag Alloy (ppm) | | | | | Ingot | | Hardness of Foil (Hv) | |
|---|---|---|---|---|---|---|---|---|---|
| | Be | La | In | Ca | Ag + Impurities | Hardness (Hv) | Conductivity (IACS %) | Immediately After Manufacture | Subjected to Temperature Cycling |
| Ag Foil of the Invention | | | | | | | | | |
| 1 | 10.8 | — | — | — | other | 40 | 117 | 92 | 83 |
| 2 | 185.2 | — | — | — | other | 48 | 110 | 99 | 95 |
| 3 | 396.4 | — | — | — | other | 48 | 109 | 100 | 94 |
| 4 | 596.0 | — | — | — | other | 52 | 107 | 101 | 94 |
| 5 | 744.8 | — | — | — | other | 58 | 102 | 104 | 95 |
| 6 | — | 30.4 | — | — | other | 42 | 116 | 91 | 83 |
| 7 | — | 232.1 | — | — | other | 45 | 112 | 94 | 87 |
| 8 | — | 374.6 | — | — | other | 47 | 110 | 94 | 89 |
| 9 | — | 553.2 | — | — | other | 47 | 111 | 96 | 90 |
| 10 | — | 725.6 | — | — | other | 52 | 107 | 96 | 90 |
| 11 | — | — | 13.2 | — | other | 40 | 112 | 92 | 88 |
| 12 | — | — | 140.6 | — | other | 42 | 112 | 94 | 88 |
| 13 | — | — | 281.3 | — | other | 44 | 111 | 95 | 90 |
| 14 | — | — | 570.6 | — | other | 50 | 109 | 94 | 89 |
| 15 | — | — | 711.7 | — | other | 57 | 107 | 97 | 90 |
| 16 | 50.4 | 36.8 | — | — | other | 44 | 108 | 92 | 90 |
| 17 | 110.2 | — | 101.4 | — | other | 51 | 107 | 100 | 94 |
| 18 | — | 151.5 | 153.3 | — | other | 52 | 110 | 97 | 92 |
| 19 | 234.1 | 229.5 | — | — | other | 54 | 109 | 101 | 97 |
| 20 | 324.5 | — | 312.1 | — | other | 57 | 107 | 106 | 101 |
| 21 | 4.2 | 4.4 | 9.8 | — | other | 48 | 107 | 98 | 92 |
| 22 | 60.8 | 54.2 | 70.5 | — | other | 52 | 108 | 101 | 97 |
| 23 | 130.2 | 154.1 | 126.7 | — | other | 51 | 110 | 103 | 98 |
| 24 | 201.4 | 205.4 | 211.8 | — | other | 53 | 107 | 108 | 101 |
| 25 | 233.1 | 241.5 | 254.6 | — | other | 50 | 106 | 108 | 101 |
| Prior Art Ag Foil | | | | | | | | | |
| 1 | — | — | — | 10.7 | other | 39 | 115 | 98 | 36 |
| 2 | — | — | — | 196.3 | other | 46 | 110 | 101 | 42 |
| 3 | — | — | — | 396.2 | other | 53 | 106 | 106 | 61 |
| 4 | — | — | — | 601.7 | other | 64 | 100 | 108 | 63 |
| 5 | — | — | — | 741.6 | other | 71 | 99 | 110 | 67 |

TABLE 2

| | Composition of Ag Alloy (ppm) | | | | | Ingot | | Hardness of Foil (Hv) | | |
|---|---|---|---|---|---|---|---|---|---|---|
| | Ca | In | Be | La | Ag + Impurities | Hardness (Hv) | Conductivity (IACS %) | Immediately After Manufacture | 6 Months After Manufacture | Subjected to Temperature Cycling |
| Ag Foil of the Invention | | | | | | | | | | |
| 26 | 10.6 | 10.6 | — | — | other | 40 | 115 | 98 | 98 | 91 |
| 27 | 12.3 | — | 746.5 | — | other | 44 | 112 | 98 | 97 | 92 |
| 28 | 11.6 | — | 96.3 | 99.2 | other | 43 | 114 | 97 | 94 | 90 |
| 29 | 13.2 | 192.6 | — | 213.6 | other | 47 | 115 | 99 | 97 | 92 |
| 30 | 15.8 | 208.3 | 204.3 | 186.4 | other | 50 | 110 | 101 | 100 | 93 |
| 31 | 251.3 | — | 30.9 | — | other | 51 | 109 | 100 | 98 | 91 |
| 32 | 254.2 | — | — | 593.1 | other | 50 | 112 | 101 | 98 | 92 |
| 33 | 246.6 | 5.8 | 6.2 | — | other | 48 | 107 | 106 | 99 | 95 |
| 34 | 250.3 | 745.1 | — | — | other | 47 | 106 | 110 | 108 | 104 |
| 35 | 248.5 | 96.4 | 102.3 | 114.5 | other | 51 | 102 | 109 | 107 | 105 |
| 36 | 496.2 | — | — | 54.1 | other | 50 | 109 | 104 | 104 | 101 |
| 37 | 503.1 | — | 42.3 | — | other | 49 | 107 | 108 | 103 | 100 |
| 38 | 514.6 | 324.1 | — | 302.1 | other | 48 | 106 | 109 | 109 | 102 |
| 39 | 493.9 | — | 304.1 | 314.2 | other | 49 | 109 | 108 | 105 | 100 |
| 40 | 499.0 | 6.8 | 10.9 | 121.3 | other | 52 | 101 | 112 | 110 | 102 |
| 41 | 750.4 | 68.4 | — | — | other | 51 | 109 | 111 | 110 | 103 |
| 42 | 733.9 | — | 213.1 | — | other | 53 | 107 | 110 | 107 | 106 |
| 43 | 752.4 | — | — | 13.2 | other | 53 | 107 | 107 | 102 | 100 |

TABLE 2-continued

| | Composition of Ag Alloy (ppm) | | | | Ingot | | Hardness of Foil (Hv) | | |
|---|---|---|---|---|---|---|---|---|---|
| | Ca | In | Be | La | Ag + Impurities | Hardness (Hv) | Conductivity (IACS %) | Immediately After Manufacture | 6 Months After Manufacture | Subjected to Temperature Cycling |
| 44 | 760.1 | 304.6 | 313.2 | — | other | 60 | 109 | 116 | 109 | 107 |
| 45 | 752.6 | 60.8 | 79.6 | 96.4 | other | 59 | 107 | 112 | 110 | 109 |
| 46 | 991.4 | 734.6 | — | — | other | 58 | 104 | 110 | 109 | 107 |
| 47 | 992.1 | — | — | 99.4 | other | 52 | 100 | 109 | 108 | 104 |
| 48 | 984.5 | — | 30.8 | 194.1 | other | 54 | 98 | 107 | 106 | 102 |
| 49 | 996.8 | 250.4 | — | 214.8 | other | 56 | 94 | 110 | 107 | 101 |
| 50 | 964.6 | 413.2 | 96.4 | 124.6 | other | 61 | 97 | 114 | 114 | 109 |
| Prior Art Ag Foil | | | | | | | | | | |
| 6 | 11.2 | — | — | — | other | 39 | 115 | 98 | 90 | 49 |
| 7 | 251.3 | — | — | — | other | 47 | 107 | 99 | 97 | 50 |
| 8 | 506.5 | — | — | — | other | 56 | 105 | 113 | 111 | 48 |
| 9 | 748.1 | — | — | — | other | 71 | 103 | 113 | 112 | 54 |
| 10 | 993.3 | — | — | — | other | 73 | 102 | 119 | 117 | 54 |

What is claimed is:

1. A foil for an interconnector of a solar cell made of a silver alloy consisting essentially of 10 ppm to 1,000 ppm to 750 ppm of at least one element selected from the group consisting of beryllium, lanthanum and indium; balance silver and unavoidable impurities.

2. A foil for an interconnector of a solar cell made of a silver alloy consisting essentially of 10 ppm to 750 ppm of at least one element selected from the group consisting of beryllium, lanthanum and indium; balance silver and unavoidable impurities.

* * * * *